(12) United States Patent
Ichikawa et al.

(10) Patent No.: US 6,273,319 B1
(45) Date of Patent: Aug. 14, 2001

(54) WAVE SOLDERING METHOD AND SYSTEM USED FOR THE METHOD

(75) Inventors: Ataru Ichikawa, Kariya; Tatsuya Kubo, Ogaki; Atsushi Furumoto, Kariya; Kenji Arai; Mitsuhiro Sugiura, both of Okazaki; Misao Tanaka, Takahama, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/229,444

(22) Filed: Jan. 13, 1999

(30) Foreign Application Priority Data

Jan. 14, 1998 (JP) .................................................. 10-017992
Dec. 22, 1998 (JP) .................................................. 10-365261

(51) Int. Cl.$^7$ .................................................. B23K 31/12
(52) U.S. Cl. .......................... 228/102; 228/37; 228/56.5; 228/8; 228/33; 228/103
(58) Field of Search ..................... 228/102, 37, 56.5, 228/8, 33, 103

(56) References Cited

U.S. PATENT DOCUMENTS 4,512,508 * 4/1985 Pachschwoll ..................... 228/180.1
4,602,730 * 7/1986 Murakawi et al. ..................... 228/37
5,979,740 * 11/1999 Rooks ..................... 228/37

FOREIGN PATENT DOCUMENTS

| 60-160193 | 8/1985 | (JP) . |
| 2-37964 | 2/1990 | (JP) . |
| 7-131143 | 5/1995 | (JP) . |

\* cited by examiner

*Primary Examiner*—M. Alexandra Elve
(74) *Attorney, Agent, or Firm*—Pillsbury Winthrop LLP

(57) ABSTRACT

In a method of soldering a work-piece in a state where the work-piece contacts a wave molten solder, a soldering process is performed while controlling an immersion depth of the work-piece into the wave molten solder to be constant. The immersion depth control is performed by changing one of a height position of the work-piece and a wave height of the wave molten solder based on a displacement amount of the work-piece in a height direction thereof. Accordingly, the soldering process can be performed with high quality even when the work-piece is thermally warped.

10 Claims, 8 Drawing Sheets

WAVE SOLDERING METHOD AND SYSTEM USED FOR THE METHOD

CROSS REFERENCE TO RELATED APPLICATIONS

This application is based upon and claims the benefit of Japanese Patent Applications No. 10-17992, filed on Jan. 14, 1998, and No. 10-365261 filed on Dec. 22, 1998, the contents of which are incorporated herein by reference.

BACKGROUND OF THE INVENTION

1. Field of the Invention

This invention relates to a wave soldering method for soldering on a reflow side of a work-piece by jetting molten solder onto the reflow side, and a system used for the wave soldering method.

2. Description of the Related Art

Conventionally, a printed circuit board is soldered by a wave soldering method to improve processing efficiency. A wave soldering system 9 coventionally used for the wave soldering method is shown in FIG. 11. The wave soldering system 9 includes two solder baths 93, 94. A flux coating device 91 for coating flux onto a reflow side of a printed circuit board 8 and a pre-heater 92 for heating the printed circuit boad 8 are disposed on an upstream side of the solder bath 93. A transfer unit 93 is disposed above these parts to sequentially transfer the printed circuit board 8.

When a soldering process is carried out by the wave soldering system 9, the printed circuit board 8 is sequentially transferred by the transfer unit 95 to pass through above the flux coating device 91, the pre-heater 92, and the solder baths 93, 94. Accordingly, the back face (reflow side) of the printed circuit board 8 is soldered. Specifically, in the solder baths 93, 94, as shown in FIG. 12, molten solder 7 is jetted upward from a wave nozzle 930 which is disposed within the solder bath 93, using a solder circulating unit 97. The printed circuit board 8 is transferred with the reflow side 81 contacting the molten solder 7.

In the conventional method and system described above, however, the printed circuit board 8 can be warped by heat transmitted from the molten solder 7. When the printed circuit board 8 is thermally warped, the following deficiencies arise. First, as shown in FIG. 13, when the printed circuit board 8 is largely warped by the heat, the position of the printed circuit board 8 where the molten solder 7 is jetted thereon may be go down. In this case, an immersion depth of the printed circuit board 8 into the molten solder 7 is unnecessarily increased. Accordingly, bridges, solder short-circuited parts, and the like are formed on the printed circuit board 8, and as shown in FIG. 14, solder climbing deficiency such that the molten solder 7 reaches the surface of the printed circuit board 8 on an opposite side of the reflow side from its side portion arises. Further, when the printed circuit board 8 is warped so that a circumference portion thereof escapes upward as shown in FIG. 15, the circumference portion may not contact the molten solder 7, thereby causing a non-soldered portion of the printed circuit board 8.

Various types of wave soldering methods and systems have been proposed to stably perform wave soldering. For example, JP-A-7-131143 discloses a method for stabilizing a soldered sate by accurately detecting a height of jetted molten solder. This kind of method for controlling a molten solder level is also disclosed in JP-A-2-37964.

However, the deficiencies caused by thermal deformation of the printed circuit board itself cannot be solved by these conventional methods. Therefore, even when the height of the jetted molten solder is precisely controlled, it is difficult to prevent the solder climbing deficiency and the occurrence of non-soldered portion.

SUMMARY OF THE INVENTION

The present invention has been made in view of the above problems. An object of the present invention is to provide a wave soldering method for soldering on a work-piece and a wave soldering system used for the method capable of performing a soldering process with high quality even when the work-piece is thermally warped.

According to the present invention, in a method for soldering on a reflow side of a work-piece by bringing the work-piece into contact with a wave molten solder, a soldering process is performed while controlling an immersion depth of the work-piece into the wave molten solder to be constant. The immersion depth of the work-piece can be controlled by adjusting one of a height position of the work-piece and a wave height of the wave molten solder based on a displacement amount of the work-piece. Accordingly, even when the work-piece is thermally warped, the immersion depth can be controlled to be constant. As a result, the soldering process can be performed with high quality.

The displacement amount can be detected by a displacement sensor serving as a displacement device. When the displacement sensor is disposed above a contact portion between the work-piece and the wave molten solder, the immersion depth can be detected directly by the displacement amount. Therefore, the one of the height position of the work-piece and the wave height of the wave molten solder can be controlled in response to the displacement amount. When the displacement amount is detected at a plurality of points of the work-piece, a warp amount of the work-piece is computed based on the displacement amount and the one of the height position of the work-piece and the wave height of the wave molten solder is controlled based on the warp amount.

In these case, the wave height of the wave molten solder can be directly detected by a wave height detecting unit. At that time, the one of the height position of the work-piece and the wave height of the wave molten solder is controlled based on the displacement amount of the work-piece and the wave height detected by the wave height detecting unit. Accordingly, the immersion depth control can be performed more precisely. Further, even when the wave height of the wave molten solder fluctuates, the immersion depth control can quickly response to the fluctuation.

The displacement amount can be detected using a light emitting device which is disposed on a side of a contact portion between the work-piece and the wave molten solder for emitting a measurement light onto a first irradiation position of one of the wave molten solder and the work-piece. In this case, the measurement light is reflected at the first irradiation position and then is reflected a second irradiation position of another one of the work-piece and the wave molten solder as a reflected light. The one of the height position of the work-piece and the wave height of the wave molten solder can be controlled so that an optical path of the reflected light becomes constant. Otherwise, the one of the height position of the work-piece and the wave height of the wave molten solder can be controlled so that an interval between the first and second irradiation positions becomes constant.

In this case, likewise, the wave height can be directly detected by the wave height detecting unit so that the immersion depth control is performed more precisely. It is preferable that the measurement light is a laser having favorable directivity, resulting in accurate immersion depth control. It is preferably that the measurement is a pulsed light. Accordingly, a change in the optical path of the reflected light or the like can be stepwise detected, resulting in high responsibility characteristics of the immersion depth control.

BRIEF DESCRIPTION OF THE DRAWINGS

Other objects and features of the present invention will become more readily apparent from a better understanding of the preferred embodiments described below with reference to the following drawings.

DETAILED DESCRIPTION OF THE PREFERRED EMBODIMENTS (First Embodiment)

Figure 1:
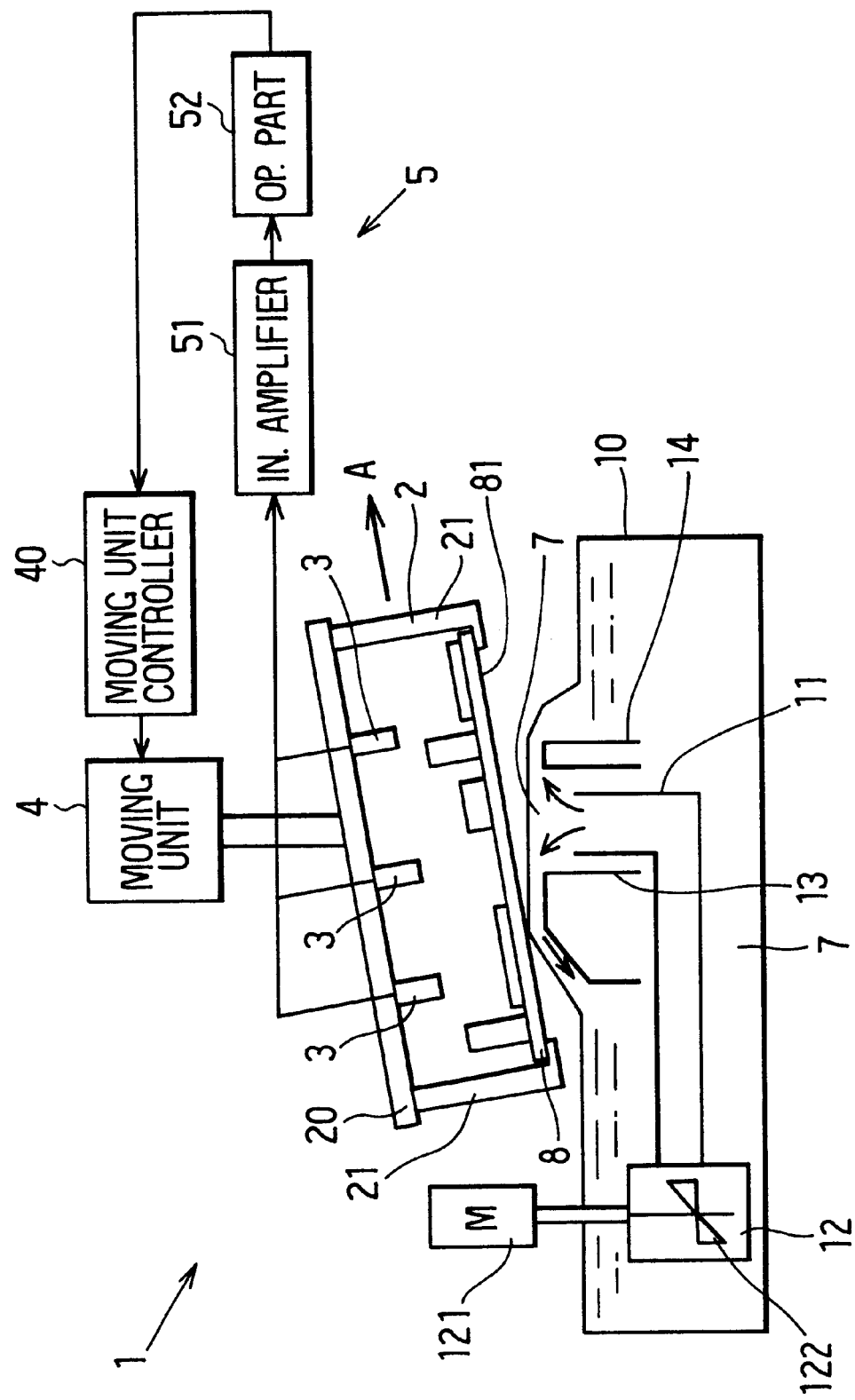
FIG. 1 is a schematic view showing a constitution of a wave soldering system in a first preferred embodiment of the present invention.

As shown in FIG. 1, a basic structure of a wave soldering system 1 in a first preferred embodiment is as follows. The wave soldering system 1 includes a solder bath 10, a wave device 12 for jetting the molten solder 7 by sending the molten solder 7 to the wave nozzle 11, and a transfer unit 2 for transferring a work-piece 8 while making the work-piece 8 coact the molten solder 7. The solder bath 10 stores molten solder 7 therein and has a wave nozzle 11 for jetting the molten solder 7. The wave soldering system 1 further includes three displacement sensors 3 respectively for detecting displacement amounts of the work-piece 8 in a height direction, i.e., in a direction perpendicular to a work-piece surface, a moving unit 4 for moving the height position of the work-piece 8 in a vertical direction in response to the displacement amounts of the work-piece 8, and a control unit for controlling the moving unit 4.

Next, the structure and operation of the wave soldering system 1 will be explained in more detail.

Figure 3:
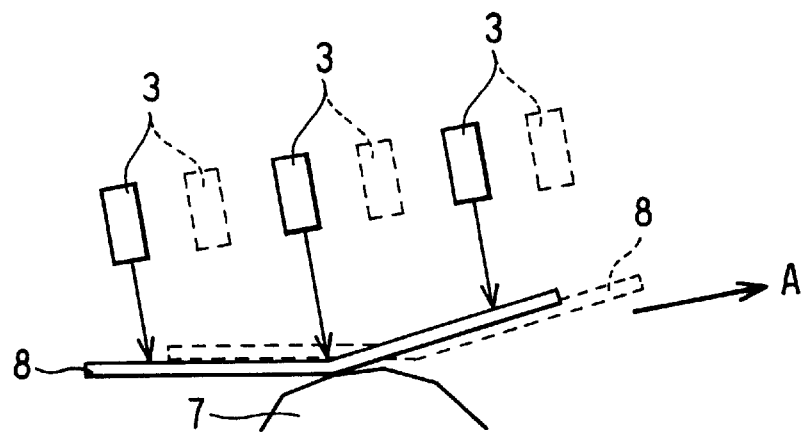
FIG. 3 is an explanatory view indicating movements of displacement sensors and the work-piece in the first embodiment.

The work-piece 8 is a printed circuit board in this embodiment and is held by the transfer unit 2 at a reflow side 81 thereof. The transfer unit 2 includes a pair of chucks 21 extending downward from a main part 20. The work-piece 8 is held by the chucks 21. Further, the transfer unit 2 is disposed in a slightly inclined state to be movable in a direction indicated by arrow A (direction A) in FIG. 1. The three displacement sensors 3 are fixed to the main part 20 of the transfer unit 2 to detect the displacement amounts of the work-piece 8 in the height direction. Accordingly, as indicated by broken lines in FIG. 3, the displacement sensors 3 move together with the transfer unit 2 and the work-piece 8 in direction A. Each of the displacement sensors 3 is electrically connected to the control unit 5 to sequentially send detecting data thereto.

The transfer unit 2 has the moving unit 4 above the main part 20 thereof. The moving unit 4 is composed of a servo motor in this embodiment, and is operated by a moving unit controller 40. The moving unit controller 40 is, as shown in FIG. 1, electrically connected to the control unit 5 and controls the moving unit 4 based on indications provided by the control unit 5. The control unit 5 includes an instrument amplifier 51 and an operation part 52. The instrument amplifier 51 executes an amplifying processing and the like of the detection data outputted from the displacement sensors 3, and the operation part 52 calculates a warp amount (warped shape) of the work-piece 8 based on the data processed by the instrument amplifier 51 and gives indications to the moving unit controller 40. The operation part 52 is composed of an A/D converter, a warp operation unit, a control signal producing unit, and a control signal output unit, which are not shown.

A warp operation in this embodiment is executed by interpolating a circular arc using the detection data from the displacement sensors 3. Further, in the warp operation, compensation is provided by experimental data including a change in the work-piece warp, which is caused by the heat of the molten scolder 7, with respect to elapsed time. Various conditions such as ambient temperature, seasons, material and a coefficient of thermal expansion of the work-piece, temperature of the molten solder 7, and the like are reflected in the experimental data.

The solder bath 10 is, as shown in FIG. 1, disposed so that the wave nozzle 11 opens upward, and guide portions 13, 14 for facilitating the flow of the molten solder 7 are disposed around the wave nozzle 11. The wave nozzle 11 is connected to the wave device 12 at a base portion thereof. The wave device 12 includes a solder circulating unit 122 which is rotated by a motor 121.

Figure 2:
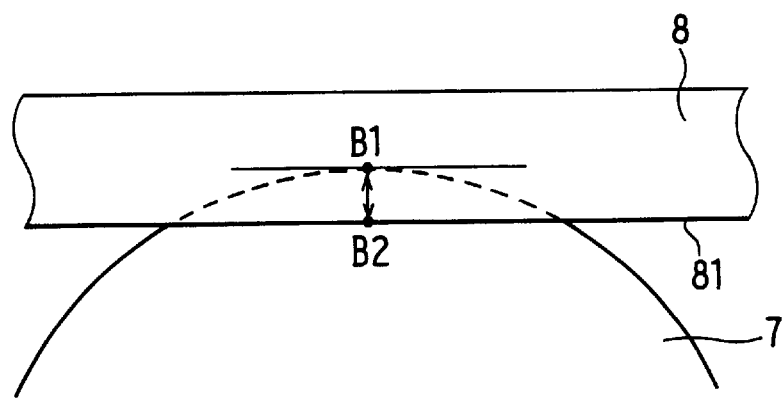
FIG. 2 is a schematic view for explaining an immersion depth of a work-piece in the first embodiment.

When a soldering process is carried out to the work-piece 8 using the wave soldering system 1 described above, as shown in FIG. 1, the molten solder 7 is jetted out and the work-piece 8 is transferred by the transfer unit 2 in direction A while contacting the molten solder 7. At that time, the immersion depth of the work-piece 8 into the molten solder 7 is controlled to be constant. As shown in FIG. 2, when it is assumed that the molten solder 7 is jetted without being intercepted by the work-piece 8, the immersion depth represents a length between point B1 on the uppermost surface of the molten solder 7 and point B2 on the reflow side 81, in a direction perpendicular to the reflow side 81.

The control of the immersion depth is performed by adjusting the height position of the work-piece 8 based on the warp amount of the work-piece 8. Specifically, the warp amount of the work-piece 8 is calculated by the control unit 5 using the detection data of the displacement amounts at three positions of the work-piece 8, respectively detected by the displacement sensors 3. Next, the moving unit 4 is moved in the vertical direction by the control unit 5 through the moving unit controller 40 according to the warp amount. As a result, the height position of the work-piece 8 is moved together with the transfer unit 2 in the vertical direction according to the warp amount of the work-piece 8. Because the warp amount of the work-piece 8 is always detected by the displacement sensors 3 moving together with the work-piece 8, the height position adjustment of the work-piece 8 in the vertical direction is accurately performed to correspond to the continuous change in the warp amount of the work-piece 8, so that the immersion depth can be kept constant. Therefore, in this embodiment, even when the work-piece 8 is thermally warped, the solder climbing deficiency and occurrence of non-soldered portions are sufficiently prevented, realizing a high quality soldering process.

In this embodiment, the displacement amount of the work-piece 8 is detected in the height direction perpendicular to the work-piece surface, and the height position of the work-piece 8 is adjusted by the moving unit 4 in the vertical direction; however, the directions in which the displacement amount is detected and in which the height position is adjusted are changeable. For example, the displacement amount can be detected in the vertical direction, and the height position can be adjusted in the height direction.

(Second Embodiment)

Figure 4:
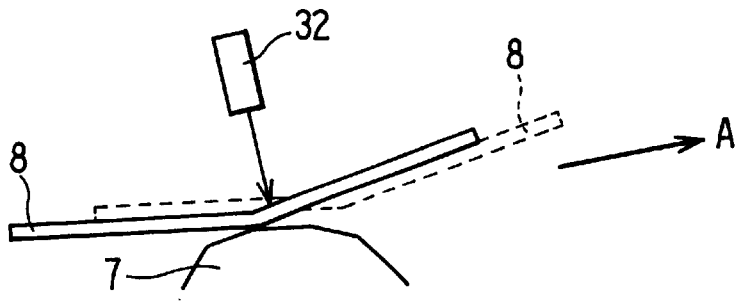
FIG. 4 is an explanatory view indicating movements of a displacement sensor and the work-piece in a second preferred embodiment.

As shown in FIG. 4, in a second preferred embodiment, a displacement sensor 32 is employed in place of the displacement sensors 3 in the first embodiment. The displacement sensor 32 is fixed at a position above the contact portion between the molten solder 7 and the work-piece 8 and detects a displacement amount of the work-piece 8. The detected displacement amount is used as control date, and the work-piece 8 is moved in the vertical direction according to the control data. A control unit in this embodiment executes PID control using a proportionator (P), an integrator (I), and differentiator (D). The other features are the same as those in the first embodiment.

In this embodiment, the work-piece 8 is moved in the vertical direction directly based on the displacement amount detected by the displacement sensor 32. Accordingly, the immersion depth of the work-piece 8 is controlled to be constant as well. In this embodiment, because the displacement sensor 32 is fixed at the position described above, the structure is simplified as compared to that in the first embodiment, and the operation in the control unit 5 is also simplified. The other effects are the same as those in the first embodiment.

(Third Embodiment)

Figure 5:
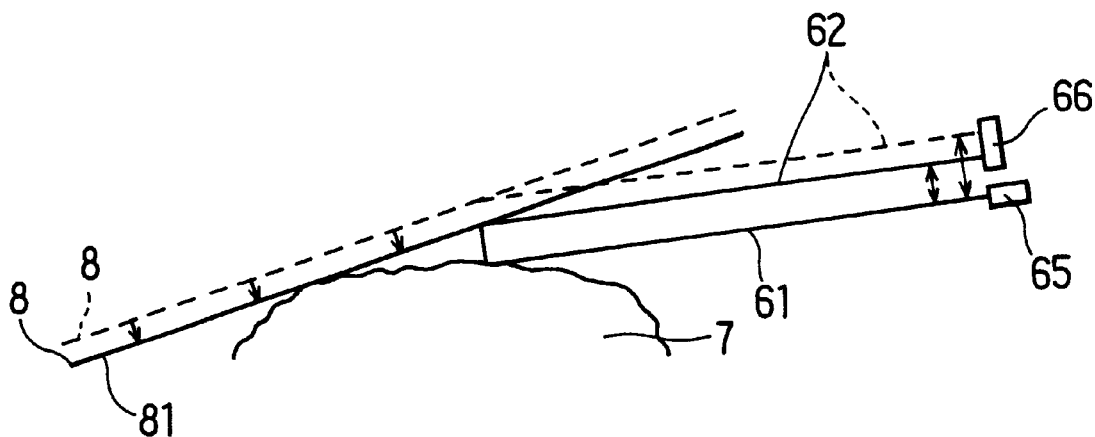
FIG. 5 is an explanatory view showing an optical path of measurement light in a third preferred embodiment.

In a third preferred embodiment, a method for controlling the work-piece immersion depth is different from that in the first embodiment. The control of the immersion depth in the third embodiment is executed as follows. As shown in FIG. 5, a wave soldering system in this embodiment includes a light emitting device 65 and a light intercepting device 66 on a forward side of the contact portion between the work-piece 8 and the molten solder 7, in addition to the transfer unit 2, the displacement sensors 3, the control unit 5, and the like employed in the first embodiment. The light emitting device 65 is a He—Ne laser emitting device which emits He—Ne pulsed laser as measurement light 61.

The measurement light 61 emitted from the light emitting device 65 is projected the molten solder 7, and is reflected by the molten solder 7 toward the processes face 81. The reflected light is further reflected by the reflow side 81 as reflected light 62, and the reflected light 62 enters the light intercepting device 66. Because the reflected light 62 is pulsed light, the irradiation of the reflected light 62 onto the light intercepting device 66 is intermittently performed. Accordingly, the light intercepting device 66 stepwise knows the deviation of the optical path of the reflected light 62. Therefore, the work-piece 8 is moved in the vertical direction to modify the deviation. That is, the height position of the work-piece 8 is adjusted in the vertical direction so that the optical path of the reflected light 62 becomes constant. As a result, the immersion depth of the work-piece 8 can be controlled to be constant. The height position of the work-piece 8 in the vertical direction is changed substantially in the same manner as in the first embodiment. The other features and effects are the same as those in the first embodiment.

(Fourth Embodiment)

Figure 6:
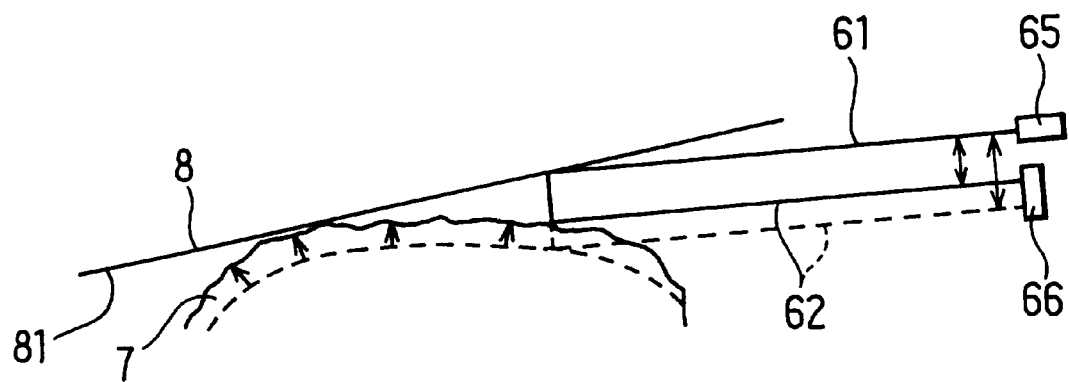
FIG. 6 is an explanatory view showing an optical path of measurement light in a fourth preferred embodiment.
Figure 7:
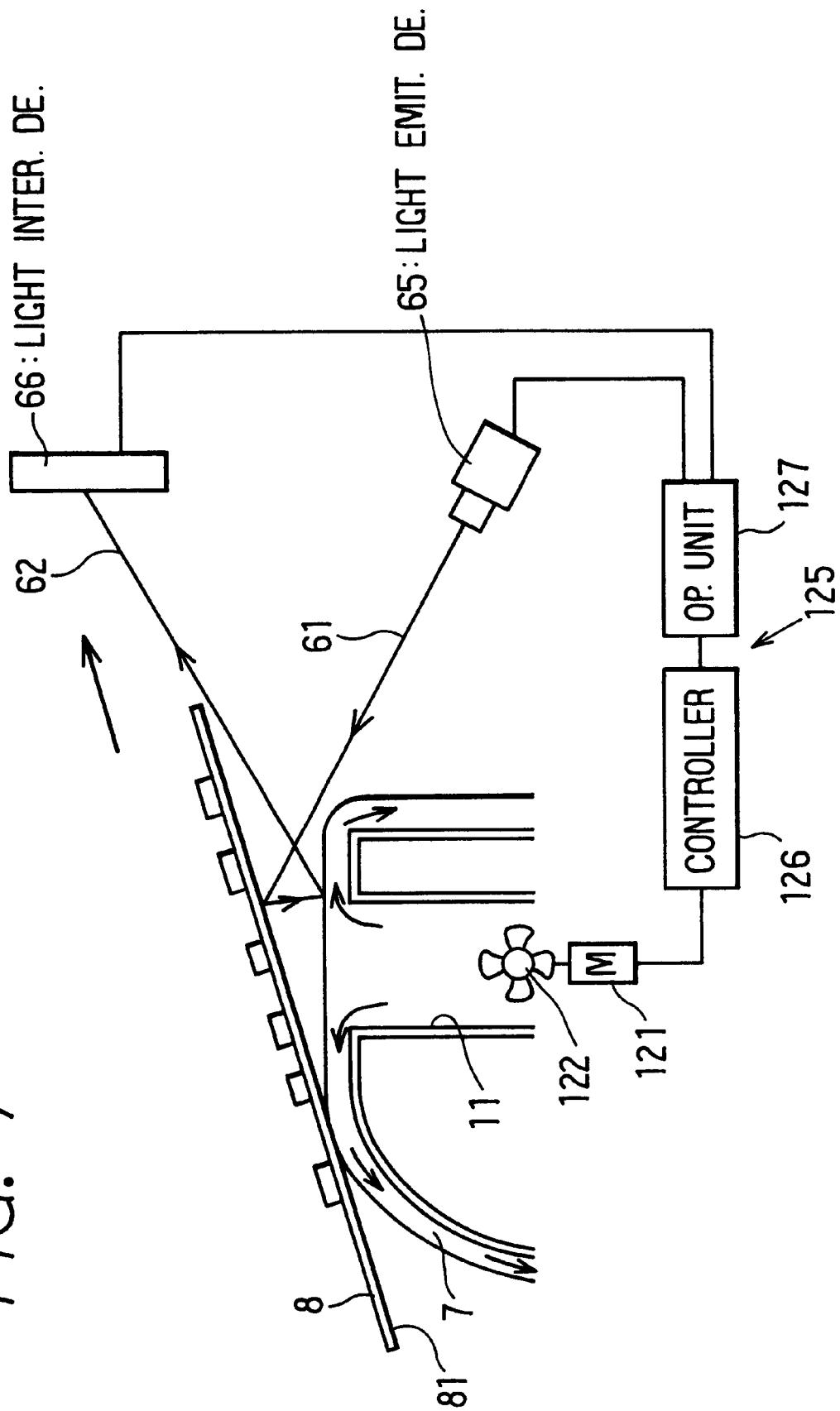
FIG. 7 is an explanatory view for explaining a control method of an immersion depth in the fourth embodiment.

In a fourth preferred embodiment, the control of the work-piece immersion depth is not performed by moving the work-piece 8 in the vertical direction, but by controlling a wave height of the molten solder 7 as shown in FIG. 6. That is, as shown in FIG. 7, a wave soldering system in the fourth embodiment includes a control unit 125 for controlling the solder circulating unit 122 and for controlling the wave height of the molten solder 7. The wave soldering system dispenses with the displacement sensors and the moving unit used in the first to third embodiments. The other features are the same as those in the third embodiment.

The control unit 125 is connected to the motor 121 for operating the solder circulating unit 122, and is composed of a controller 126 and an operation unit 127. The operation unit 127 is electrically connected to the light emitting device 65 and the light intercepting device 66 similar to those in the third embodiment. Accordingly, the optical path of the reflected light 62 is determined in the operation unit 127.

The light emitting device 65 and the light intercepting device 66 may be arranged as shown in FIG. 7 so that the measurement light 61 and the reflected light 62 intersect one another, and may be arranged as shown in FIG. 6 so that the lights 61, 62 become parallel to one another. These arrangements can be flexibly set according to the jet shape of the molten solder 7 and the like. In this embodiment, the wave height of the molten solder 7 is controlled in the vertical direction so that the optical path of the reflected light 62 becomes constant. Therefore, the immersion depth of the work-piece 8 can be controlled without using the moving unit and the like. The other effects are the same as those in the third embodiment.

(Fifth Embodiment)

In a fifth preferred embodiment, in place of the control utilizing the optical path of the reflected light 62, the immersion depth is controlled by controlling irradiation position C of the measurement light 61 onto the molten solder 7 and irradiation position D of the reflected light onto the reflow side 81 to be constant.

Figure 8:
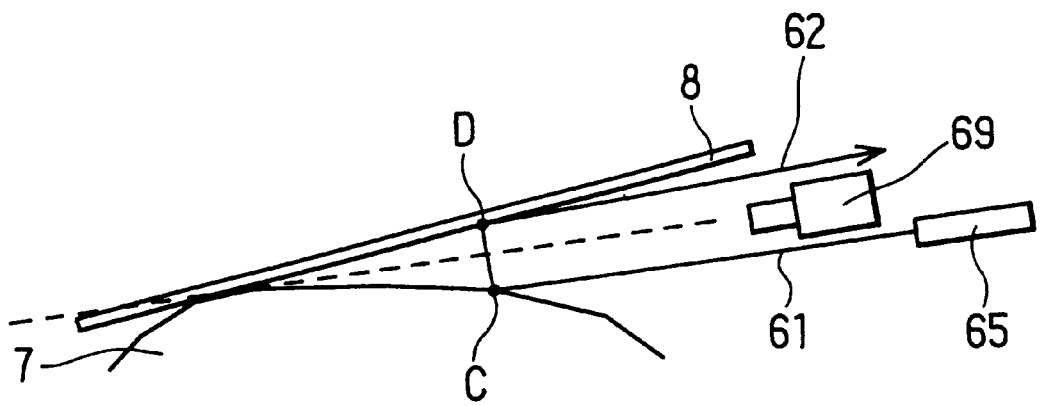
FIG. 8 is an explanatory view showing an optical path of measurement light and an arrangement of a CCD camera in a fifth preferred embodiment.
Figure 9:
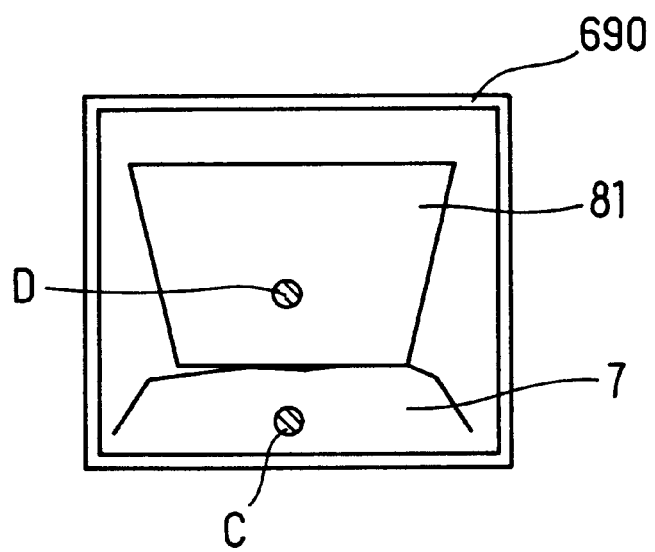
FIG. 9 is a schematic view showing an image of irradiation positions in the fifth embodiment.

Specifically, as shown in FIG. 8, the light emitting device 65 for emitting He-Ne laser as in the third embodiment and a CCD camera 69 for processing images of the irradiation positions C, D as image data are disposed on the forward side of the contact portion between the reflow side 81 of the work-piece 8 and the molten solder 7. The CCD camera 69 is connected to an image processing apparatus which is not shown, and produces an image 690 as shown in FIG. 9. Further, the moving unit and the control unit substantially the same as those in the first and third embodiments are provided to adjust the work-piece in the height direction. In this case, the work-piece 8 is moved in the vertical direction by the moving unit and the control unit so that an interval between the irradiation positions C, D become constant. Accordingly, the immersion depth is controlled to be constant. In this case, the wave height of the molten solder 7 can be controlled so that the interval between the irradiation positions C, D becomes constant. The other effects are the same as those in the third embodiment.

(Sixth Embodiment)

Figure 10:
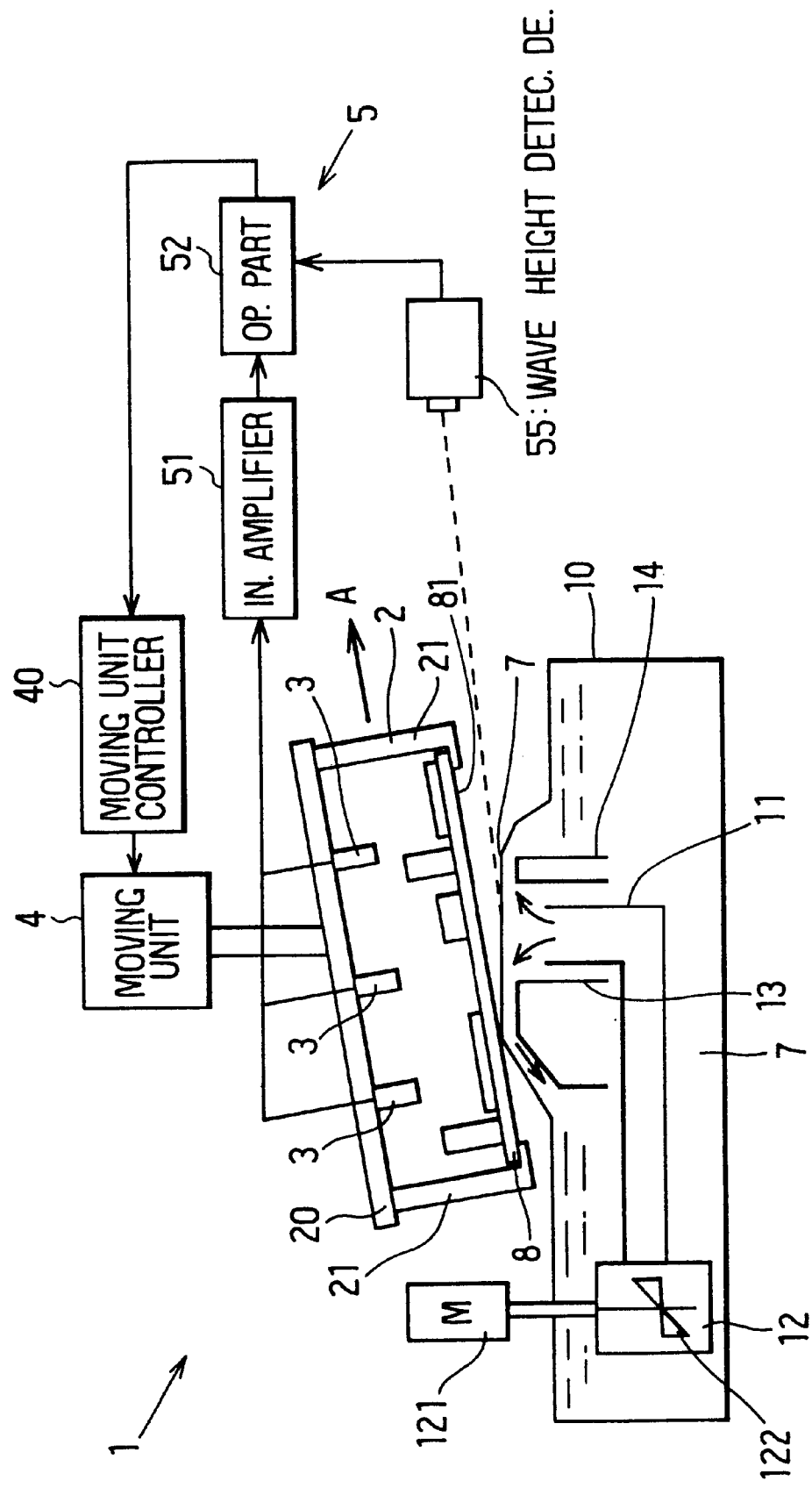
FIG. 10 is a schematic view showing a constitution of a wave soldering system in a sixth preferred embodiment.
Figure 11:
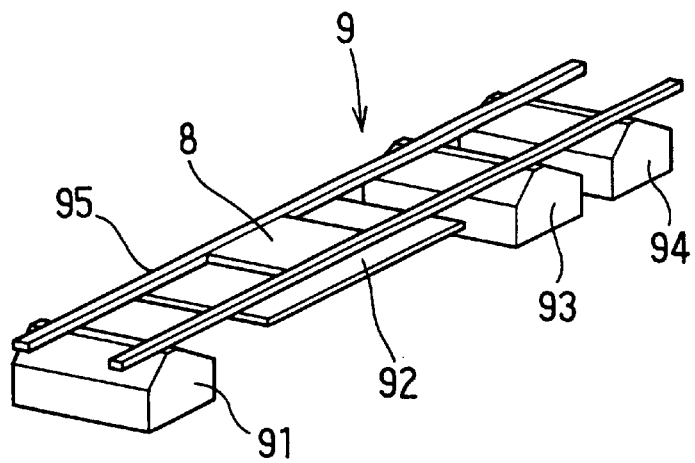
FIG. 11 is a schematic view showing a constitution of a wave soldering system according to a prior art.
Figure 12:
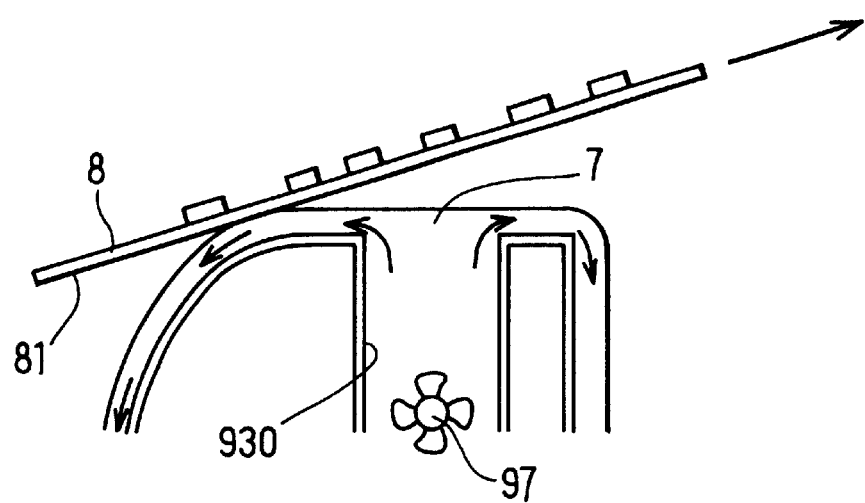
FIG. 12 is a schematic view for explaining a wave soldering method according to the prior art.
Figure 13:
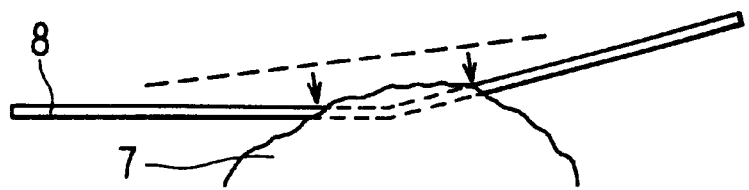
FIGS. 13 to 15 are explanatory views showing soldering deficiencies in the prior art.
Figure 14:
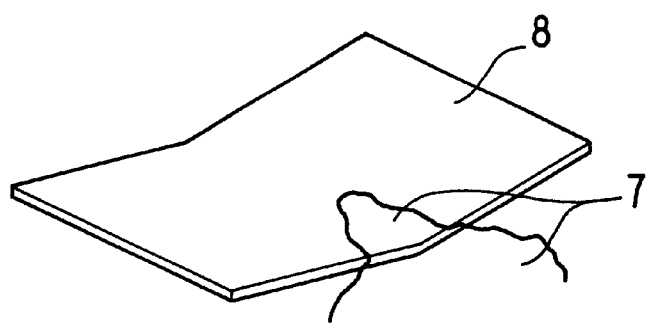
Figure 15:
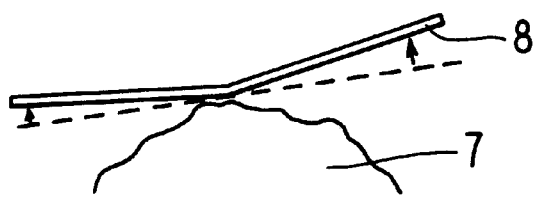

In a sixth preferred embodiment, as shown in FIG. 10, the control unit 5 of the wave soldering system 1 includes a wave height detecting device 55. The wave height detecting device 55 is composed of a CCD camera for monitoring a jetted top portion of the molten solder 7 and is electrically connected to the operation part 52 of the control unit 5. The operation part 52 additionally includes a wave height operation unit, in addition to the A/D converter, the warp operation unit, the control signal producing unit, and the control signal output unit. The wave height operation unit computes the wave height of the molten solder 7 based on signals from the CCD camera. Then, the control signal producing unit gives control instructions to the moving unit controller 40 based on the warp amount and the wave height outputted from the warp operation unit and the wave height operation unit. In this embodiment, although the CCD camera is used as the wave height detecting device 55 so as to detect the wave height by processing the images, other types of detectors such as an eddy current detector capable of directly detecting the wave height may be adopted as the wave height detecting device 55. The other features are the same as those in the first embodiment.

In this embodiment, not only the warp amount of the work-piece 8 but also the wave height of the molten solder 7 is considered to control the work-piece height. Therefore, even when the wave height of the molten solder 7 fluctuates, the work-piece height is appropriately controlled in response to the fluctuation of the wave height. As a result, the immersion depth of the work-piece 8 can be controlled precisely more than that in the first embodiment. The other effects are the same as those in the first embodiment. In this embodiment, although the wave height control device 55 is adopted to the wave soldering system 1 in the first embodiment, it may be adopted to any one of the systems in the second to fifth embodiments. In either case, the immersion depth can be precisely controlled.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A wave soldering system for soldering on a work-piece by a wave molten solder, the system comprising:

a solder bath for storing a molten solder therein;

a wave device equipped with the solder bath for jetting the molten solder as the wave molten solder from the solder bath onto the work-piece;

a transfer unit disposed above the solder bath for transferring the work-piece while bringing the work-piece into contact with the wave molten solder;

a displacement detecting device for detecting a warp amount of the work-piece which is caused by heat, the warp amount being detected from displacement amounts of a plurality of points of the work-piece in a height direction perpendicular to a work-piece surface; and an adjustment device for controlling an immersion depth of the work-piece into the wave molten solder to be constant by adjusting one of a height position of the work-piece and a wave height of the wave molten solder in the height direction based on the warp amount of the work-piece.

2. The system of claim 1, wherein:

the displacement detecting device includes a displacement sensor disposed above the work-piece on a side opposite the solder bath and detects the height position of the work-piece in the height direction; and the adjustment device includes a moving unit for moving the work-piece, and a moving unit controller for controlling the moving unit based on the height position detected by the displacement sensor.

3. The system of claim 2, wherein the displacement sensor is disposed above a contact portion between the work-piece and the wave molten solder.

4. The system of claim 2, wherein the displacement detecting device includes a plurality of displacement sensors disposed above the work-piece and fixed to the transfer unit for detecting the displacement amount at the plurality of points of the work-piece.

5. The system of claim 4, wherein the displacement amount is detected at least at three points of the work-piece.

6. The system of claim 2, further comprising a wave height detecting unit for detecting the wave height of the wave molten solder, wherein the moving unit moves the work-piece based on the wave height detected by the wave height detecting unit and the height position detected by the displacement sensor.

7. The system of claim 1, wherein:

the displacement detecting device includes a wave height detecting unit for detecting the wave height of the wave molten solder; and the adjustment device includes a wave device controller for controlling the wave device to adjust the wave height of the wave molten solder based on the wave height detected by the wave height detecting unit.

8. The system of claim 1, wherein:

the displacement detecting device includes a light emitting device disposed on a side of a contact portion between the wave molten solder and the work-piece for emitting a measurement light onto an irradiation position of one of the wave molten solder and the work-piece so that the measurement light is reflected by the wave molten solder and the work-piece, respectively, as a reflected light, and a light intercepting device disposed on the side of the contact portion for receiving the reflected light to detect an optical path of the reflected light, the irradiation position being adjacent to the contact portion and facing another one of the wave molten solder and the reflow side; and the adjustment device adjusts one of a height position of the work-piece and a wave height of the wave molten solder so that the optical path of the reflected light becomes constant.

9. The system of claim 8, further comprising a wave height detecting unit for detecting the wave height of the wave molten solder, wherein the adjustment device moves the work-piece based on the wave height detected by the wave height detecting unit.

10. The system of claim 1, wherein:

the displacement detecting device includes a light emitting device disposed on a side of a contact portion between the wave molten solder and the work-piece for emitting a measurement light onto a first irradiation position of one of the wave molten solder and the work-piece so that the measurement light is reflected at the first irradiation position and then is reflected at a second irradiation position of another one of the wave molten solder and the work-piece, and an image processing device disposed on the side of the contact portion for detecting the first and second irradiation positions as an image date; and the adjustment device adjusts one of a height position of the work-piece and a wave height of the wave molten solder so that an interval between the first and second irradiation positions becomes constant.

* * * * *